US009536730B2

(12) United States Patent
Lee et al.

(10) Patent No.: US 9,536,730 B2
(45) Date of Patent: Jan. 3, 2017

(54) CLEANING FORMULATIONS

(71) Applicant: AIR PRODUCTS AND CHEMICALS INC., Allentown, PA (US)

(72) Inventors: Yi Chia Lee, Dansheui (TW); Madhukar Bhaskara Rao, Fogelsville, PA (US); Gautam Banerjee, Latham, NY (US); Wen Dar Liu, Chupei (TW); Aiping Wu, Macungie, PA (US); Seiji Inaoka, Midland, MI (US)

(73) Assignee: AIR PRODUCTS AND CHEMICALS, INC., Allentown, PA (US)

( * ) Notice: Subject to any disclaimer, the term of this patent is extended or adjusted under 35 U.S.C. 154(b) by 392 days.

(21) Appl. No.: 14/010,748

(22) Filed: Aug. 27, 2013

(65) Prior Publication Data

US 2014/0109931 A1  Apr. 24, 2014

Related U.S. Application Data

(60) Provisional application No. 61/717,152, filed on Oct. 23, 2012, provisional application No. 61/817,134, filed on Apr. 29, 2013.

(51) Int. Cl.
| | | |
|---|---|---|
| *C11D 7/50* | (2006.01) | |
| *H01L 21/02* | (2006.01) | |
| *C11D 7/10* | (2006.01) | |
| *C11D 7/26* | (2006.01) | |
| *C11D 7/32* | (2006.01) | |
| *G03F 7/42* | (2006.01) | |

(52) U.S. Cl.
CPC .......... *H01L 21/02052* (2013.01); *C11D 7/10* (2013.01); *C11D 7/265* (2013.01); *C11D 7/3209* (2013.01); *C11D 7/3218* (2013.01); *C11D 7/3281* (2013.01); *C11D 7/5013* (2013.01); *C11D 7/5022* (2013.01); *G03F 7/425* (2013.01); *G03F 7/426* (2013.01)

(58) Field of Classification Search
CPC ............................. C11D 11/0047; C11D 7/50
See application file for complete search history.

(56) References Cited

U.S. PATENT DOCUMENTS

| | | |
|---|---|---|
| 5,279,771 A | 1/1994 | Lee |
| 5,417,877 A | 5/1995 | Ward |
| 5,746,837 A | 5/1998 | Beck et al. |
| 6,117,783 A | 9/2000 | Small et al. |
| 6,248,704 B1 | 6/2001 | Small et al. |

(Continued)

FOREIGN PATENT DOCUMENTS

| | | |
|---|---|---|
| EP | 0 647 884 A1 | 4/1995 |
| EP | 1736534 A1 | 12/2006 |

(Continued)

*Primary Examiner* — Gregory Webb
(74) *Attorney, Agent, or Firm* — Anne B. Kiernan; Joseph D. Rossi

(57) ABSTRACT

A composition and method for removing copper-containing post-etch and/or post-ash residue from patterned microelectronic devices is described. The removal composition includes water, a water-miscible organic solvent, an amine compound, an organic acid, and a fluoride ion source. The compositions effectively remove the copper-containing post-etch residue from the microelectronic device without damaging exposed low-k dielectric and metal interconnect materials.

21 Claims, 1 Drawing Sheet

(56) References Cited

U.S. PATENT DOCUMENTS

| | | |
|---|---|---|
| 6,326,130 B1 | 12/2001 | Schwartzkopf et al. |
| 6,749,998 B2 | 6/2004 | Schwartzkopf et al. |
| 6,755,989 B2 | 6/2004 | Wojtczak et al. |
| 6,787,293 B2 | 9/2004 | Oowada et al. |
| 7,250,391 B2 | 7/2007 | Kanno et al. |
| 7,399,365 B2 | 7/2008 | Aoyama et al. |
| 7,479,474 B2 | 1/2009 | Cernat et al. |
| 7,700,533 B2 | 4/2010 | Egbe et al. |
| 7,718,591 B2 | 5/2010 | Hsu |
| 7,723,280 B2 | 5/2010 | Brainard et al. |
| 8,003,587 B2 * | 8/2011 | Lee .................. G03F 7/425 134/1.3 |
| 8,062,429 B2 * | 11/2011 | Lee .................. C11D 7/3263 134/1.3 |
| 8,951,948 B2 * | 2/2015 | Rath .................. C11D 11/0047 510/175 |
| 2001/0050350 A1 | 12/2001 | Wojtczak et al. |
| 2003/0078173 A1 | 4/2003 | Wojtczak et al. |
| 2003/0130149 A1 * | 7/2003 | Zhou .................. C11D 7/3218 510/176 |
| 2003/0181342 A1 * | 9/2003 | Seijo .................. C11D 7/265 510/175 |
| 2004/0018949 A1 | 1/2004 | Lee |
| 2004/0038840 A1 * | 2/2004 | Lee .................. C11D 3/0073 510/202 |
| 2004/0171503 A1 | 9/2004 | Rovito et al. |
| 2004/0220065 A1 | 11/2004 | Hsu |
| 2005/0014667 A1 | 1/2005 | Aoyama et al. |
| 2005/0090416 A1 * | 4/2005 | Lee .................. C11D 3/30 510/175 |
| 2005/0187118 A1 * | 8/2005 | Haraguchi .............. C11D 7/10 510/175 |
| 2005/0215446 A1 | 9/2005 | Wojtczak et al. |
| 2006/0016785 A1 | 1/2006 | Egbe et al. |
| 2006/0178282 A1 | 8/2006 | Suyama et al. |
| 2006/0237392 A1 | 10/2006 | Auger et al. |
| 2006/0270573 A1 | 11/2006 | Ikemoto et al. |
| 2006/0293208 A1 * | 12/2006 | Egbe .................. C11D 7/3263 510/407 |
| 2007/0078073 A1 | 4/2007 | Auger |
| 2007/0179072 A1 * | 8/2007 | Rao .................. C11D 7/08 510/175 |
| 2008/0139436 A1 * | 6/2008 | Reid .................. C11D 3/044 510/176 |
| 2008/0169004 A1 * | 7/2008 | Wu .................. C11D 7/08 134/2 |
| 2008/0242574 A1 * | 10/2008 | Rath .................. G03F 7/423 510/176 |
| 2009/0032766 A1 * | 2/2009 | Rajaratnam ....... H01L 21/31111 252/79.1 |
| 2009/0099051 A1 | 4/2009 | Aoyama et al. |
| 2009/0163396 A1 * | 6/2009 | Hsu .................. C11D 3/3947 510/176 |
| 2009/0203566 A1 * | 8/2009 | Lee .................. G03F 7/425 510/175 |
| 2009/0301996 A1 | 12/2009 | Visintin et al. |
| 2010/0035785 A1 | 2/2010 | Wojtczak et al. |
| 2010/0043823 A1 * | 2/2010 | Lee .................. C11D 7/3263 134/1.3 |
| 2010/0152086 A1 | 6/2010 | Wu et al. |
| 2010/0163788 A1 | 7/2010 | Visintin et al. |
| 2011/0117751 A1 | 5/2011 | Sonthalia et al. |
| 2012/0048295 A1 * | 3/2012 | Du .................. C11D 7/3245 134/3 |

FOREIGN PATENT DOCUMENTS

| | | |
|---|---|---|
| EP | 1813667 A1 | 8/2007 |
| EP | 2500407 A1 | 9/2012 |
| JP | 2005522027 | 7/2005 |
| JP | 2005528660 | 9/2005 |
| JP | 2005532691 | 10/2005 |
| JP | 2008198994 | 8/2006 |
| JP | 2008277718 | 11/2008 |
| JP | 2010147476 | 7/2010 |
| WO | 2006110645 A2 | 10/2006 |
| WO | 2006129549 | 12/2006 |
| WO | 2009073588 A1 | 6/2009 |

* cited by examiner

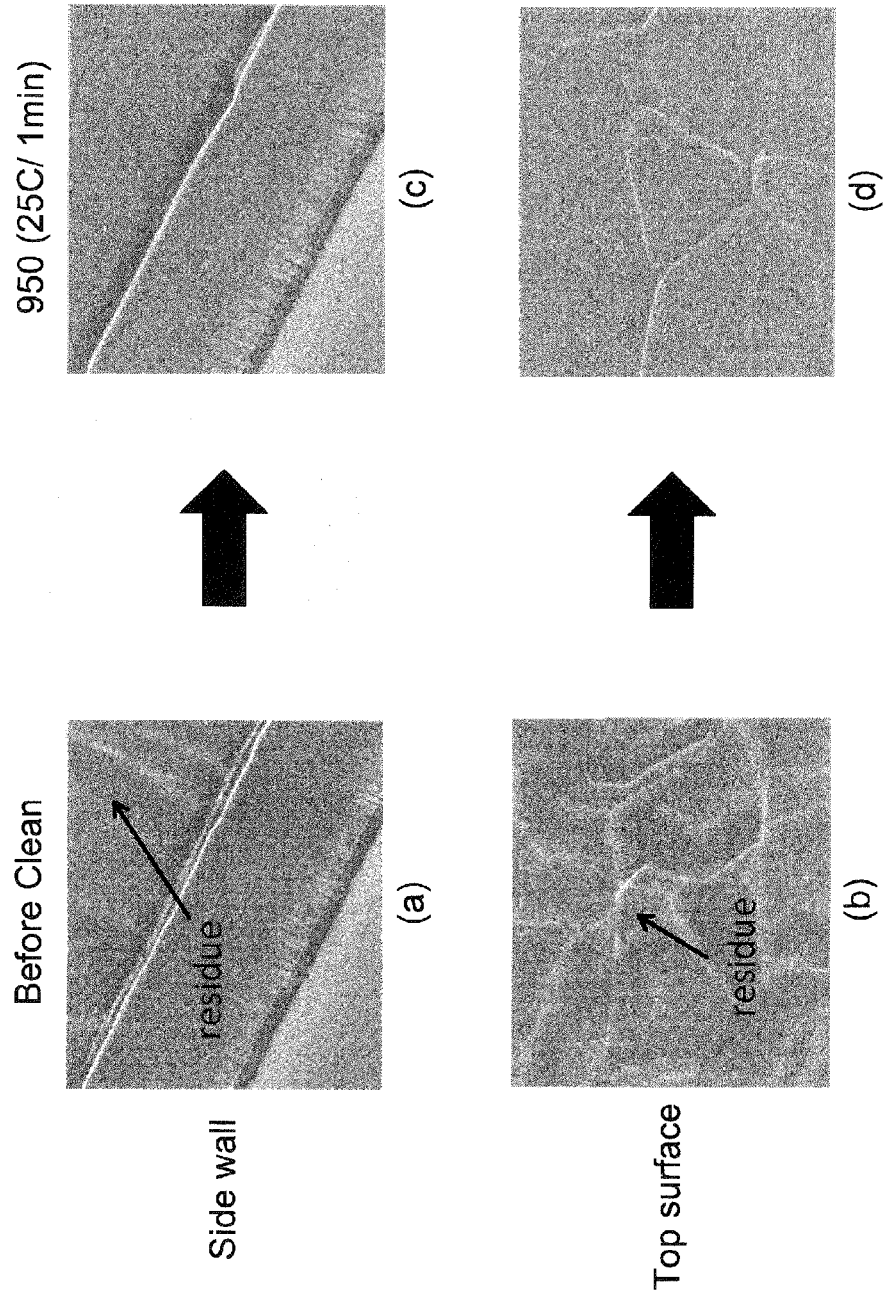

CLEANING FORMULATIONS

CROSS-REFERENCE TO RELATED APPLICATIONS

This nonprovisional application claims the benefit of U.S. Application No. 61/717,152, filed on Oct. 23, 2012, and U.S. Application No. 61/817,134, filed on Apr. 29, 2013, both provisional applications having the same title as the present application. U.S. Application Nos. 61/717,152 and 61/817,134 are hereby incorporated by reference in their entireties.

BACKGROUND OF THE INVENTION

The present invention relates to cleaning compositions that can be used for a variety of applications including, for example, removing unwanted resist films, post-etch, and post-ash residue on a semiconductor substrate. In particular, the present invention relates to cleaning compositions useful for the removal of residue, preferably copper-containing post-etch and/or post-ash residue, from the surface of substrates, preferably microelectronic devices, and methods of using said compositions for removal of same.

The background of the present invention will be described in connection with its use in cleaning applications involving the manufacture of integrated circuits. It should be understood, however, that the use of the present invention has wider applicability as described hereinafter.

In the manufacture of integrated circuits, it is sometimes necessary to etch openings or other geometries in a thin film deposited or grown on the surface of silicon, gallium arsenide, glass, or other substrate located on an in-process integrated circuit wafer. Present methods for etching such a film require that the film be exposed to a chemical etching agent to remove portions of the film. The particular etching agent used to remove the portions of the film depends upon the nature of the film. In the case of an oxide film, for example, the etching agent may be hydrofluoric acid. In the case of a polysilicon film, it will typically be hydrofluoric acid or a mixture of nitric acid and acetic acid.

In order to assure that only desired portions of the film are removed, a photolithography process is used, through which a pattern in a computer drafted photo mask is transferred to the surface of the film. The mask serves to identify the areas of the film which are to be selectively removed. This pattern is formed with a photoresist material, which is a light sensitive material spun onto the in-process integrated circuit wafer in a thin film and exposed to high intensity radiation projected through the photo mask. The exposed or unexposed photoresist material, depending on its composition, is typically dissolved with developers, leaving a pattern which allows etching to take place in the selected areas, while preventing etching in other areas. Positive-type resists, for example, have been extensively used as masking materials to delineate patterns on a substrate that, when etching occurs, will become vias, trenches, contact holes, etc.

Increasingly, a dry etching process such as, for example, plasma etching, reactive ion etching, or ion milling is used to attack the photoresist-unprotected area of the substrate to form the vias, trenches, contact holes, etc. As a result of the plasma etching process, photoresist, etching gas and etched material by-products are deposited as residues around or on the sidewall of the etched openings on the substrate.

Such dry etching processes also typically render the resist mask extremely difficult to remove. For example, in complex semiconductor devices such as advanced DRAMS and logic devices with multiple layers of back end lines of interconnect wiring, reactive ion etching (RIE) is used to produce vias through the interlayer dielectric to provide contact between one level of silicon, silicide or metal wiring to the next level of wiring. These vias typically expose, Al, AlCu, Cu, Ti, TiN, Ta, TaN, silicon or a silicide such as, for example, a silicide of tungsten, titanium or cobalt. The RIE process, for example, leaves a residue on the involved substrate comprising a complex mixture that may include, for example, re-sputtered oxide material, polymeric material derived from the etch gas, and organic material from the resist used to delineate the vias.

Additionally, following the termination of the etching step, the photoresist and etch residues must be removed from the protected area of the wafer so that the final finishing operation can take place. This can be accomplished in a plasma "ashing" step by the use of suitable plasma ashing gases. This typically occurs at high temperatures, for example, above 200° C. Ashing converts most of the organic residues to volatile species, but leaves behind on the substrate a predominantly inorganic residue. Such residue typically remains not only on the surface of the substrate, but also on the inside walls of vias that may be present. As a result, ash-treated substrates are often treated with a cleaning composition typically referred to as a "liquid stripping composition" to remove the highly adherent residue from the substrate. Finding a suitable cleaning composition for removal of this residue without adversely affecting, e.g., corroding, dissolving or dulling, the metal circuitry has also proven problematic. Failure to completely remove or neutralize the residue can result in discontinuances in the circuitry wiring and undesirable increases in electrical resistance.

Cleaning of post-etch residues remains a critical process step for any low-k dielectric material to succeed. As the dielectric constant of the low-k material pushes below 2.4, the chemical and mechanical sensitivity increases (e.g., chemical strength decreases, etc.), thereby requiring shorter process times and/or less aggressive chemistries. Unfortunately, shorter process times generally translates to more aggressive chemistries which can have a detrimental effect on the low-k dielectric material, as well as other stack materials (e.g., copper, etch stop, etc.). Thus, improved cleaning chemistries with very high selectivity are desired.

Prior art stripping compositions include, for example: U.S. Pat. No. 7,399,356 (Aoyama), U.S. Pat. No. 6,755,989 (Wojtczak), U.S. Pat. No. 7,250,391 (Kanno), U.S. Pat. No. 7,723,280 (Brainard), U.S. patent application Publication No. 2006/0016785 (Egbe); U.S. patent application Publication No. 2006/0178282 (Suyama), U.S. patent application Publication No. 2006/0237392 (Auger), U.S. patent application Publication No. 2006/0270573 (Ikemoto), U.S. patent application Publication No. 2007/0078073 (Auger), and U.S. patent application Publication No. 2009/0301996 (Visintin). Such prior art stripping compositions for removing the etching residue suffer, however, from significant drawbacks. For example, their use tends to erode copper wire exposed on the bottoms of via holes. Moreover, where porous interlayer low-k dielectrics are concerned, prior art stripping compositions either etch the porous interlayer dielectric materials or include components that adsorb into the pores thus increasing the dielectric constant, k, of the dielectric materials, which may potentially negatively impact the performance of the ultimate device.

With respect to U.S. Pat. No. 7,723,280, the solvent mixture includes an ether. Ether solvents, however, have the potential to damage the low-k layer. In particular, ether solvents can penetrate the porous low-k dielectric layer thereby increasing the layer's dielectric constant. Thus, ether solvents can contaminate the porous low-k layer and adversely affect its insulation ability. In addition, ether solvents can adversely affect and increase the copper etch rate.

Therefore, there is a need in the art for a cleaning composition for back end of the line cleaning operations that effectively cleans substrates comprising porous interlayer dielectric layers, but does not significantly etch metals (e.g., Cu, Al) or the porous low-k dielectrics, and that does not significantly negatively impact the dielectric constant of the porous low-k films.

BRIEF SUMMARY OF THE INVENTION

The present invention satisfies this need by providing a composition useful for removing residue from a semiconductor substrate, the composition comprising: a) from about 15% to about 50% by weight of water; b) from about 10% to about 65% by weight of a water-miscible organic solvent; c) from about 1% to about 50% by weight of an amine compound selected from the group consisting of a at least one alkanolamine and aminopropylmorpholine; d) from about 1% to about 25% by weight of an organic acid; and e) from about 0.01% to about 8% by weight of a fluoride ion source, wherein the water-miscible organic solvent is not an ether.

In another aspect, the present invention provides a method for removing residue from a semiconductor substrate, the method comprising the steps of: contacting the semiconductor substrate with a cleaning composition of claim 1, wherein the semiconductor substrate comprises a porous dielectric material having a dielectric constant; rinsing the cleaning composition from the semiconductor substrate; and drying the semiconductor substrate, wherein the dielectric constant of the porous dielectric material does not increase more than 0.50.

In yet another aspect, the present invention provides a replenishment composition to be added to a cleaning composition, said replenishment composition comprises a) from about 20% to about 84% by weight of water; b) from about 15% to about 40% by weight of a water-miscible organic solvent, wherein the water-miscible solvent is not an ether; c) from about 1% to about 5% by weight of an amine compound selected from the group consisting of at least one alkanolamine and at least one aminopropylmorpholine.

In yet another aspect, the present invention provides a method for removing unwanted residues from a semiconductor substrate comprising the steps of: contacting the semiconductor substrate with a cleaning composition comprising: a) from about 15% to about 50% by weight of water; b) from about 10% to about 65% by weight of a water-miscible organic solvent, wherein the water-miscible solvent is not an ether; c) from about 1% to about 20% by weight of an amine compound selected from the group consisting of at least one alkanolamine and at least one aminopropylmorpholine; d) from about 1% to about 25% by weight of at least one organic acid; and e) from about 0.01% to about 8% by weight of a fluoride ion source, wherein said contacting step results in a loss of a portion of said cleaning composition; and adding a replenishment composition to said cleaning composition; said replenishment composition comprising: a) from about 20% to about 84% by weight of water; b) from about 15% to about 40% by weight of a water-miscible organic solvent, wherein the water-miscible solvent is not an ether; c) from about 1% to about 5% by weight of an amine compound selected from the group consisting of at least one alkanolamine and at least one aminopropylmorpholine.

In yet another aspect, the present invention provides a composition useful for removing residue from a semiconductor substrate, the composition consisting essentially of: a) from about 15% to about 50% by weight of water; b) from about 10% to about 65% by weight of a water-miscible organic solvent selected from the group consisting of propylene glycol, glycerol, dimethylacetamide, tetrahydrofuryl alcohol, ethylene glycol, hexylene glycol, and mixtures thereof; c) from about 1% to about 50% by weight of an amine compound selected from the group consisting of a at least one alkanolamine and aminopropylmorpholine; d) from about 1% to about 25% by weight of an organic acid; e) from about 0.01% to about 8% by weight of a fluoride ion source; and f) optionally, from about 0.1% to about 15% by weight of a Cu corrosion inhibitor selected from the group consisting of benzotriazole, amino-benzotriazole, L-ascorbic acid, gallic acid, vanillin, diethylhydroxylamine, and mixtures thereof.

In still yet another aspect, the present invention provides a composition useful for removing residue from a semiconductor substrate, the composition consisting essentially of: a) from about 15% to about 50% by weight of water; b) from about 10% to about 65% by weight of a water-miscible organic solvent, wherein the water-miscible solvent is not an ether; c) from about 1% to about 50% by weight of an amine compound selected from the group consisting of a at least one alkanolamine and aminopropylmorpholine; d) from about 1% to about 25% by weight of an organic acid; e) from about 0.01% to about 8% by weight of a fluoride ion source; and f) optionally, from about 0.1% to about 15% by weight of a Cu corrosion inhibitor selected from the group consisting of benzotriazole, amino-benzotriazole, L-ascorbic acid, gallic acid, vanillin, diethylhydroxylamine, and mixtures thereof.

BRIEF DESCRIPTION OF THE DRAWING

FIG. 1 shows (a) a side wall view and (b) a top surface view including residue present on these surfaces before cleaning and (c) the side wall view and (d) the top surface view after cleaning with cleaning composition 9SO described in the examples.

DETAILED DESCRIPTION OF THE INVENTION

The present invention provides a composition whose components are present in amounts that effectively remove residue from a substrate such as, for example, a semiconductor substrate. In applications concerning semiconductor substrates, such residues include, for example, photoresist residues, ash residues, and etch residues such as, for example, residues caused by reactive ion etching. Moreover, a semiconductor substrate also includes metal, silicon, silicate and/or inter-level dielectric material such as deposited silicon oxides, which will also come into contact with the cleaning composition. Typical metals include copper, copper alloy, titanium, titanium nitride, tantalum, tantalum nitride, aluminum and/or aluminum alloy. The cleaning composition of the present invention is compatible with such materials as they exhibit a low metal and/or dielectric etch rate. In particular, compositions providing a copper etch rate of 4 Å/min or less, 3 Å/min or less, or 2 Å/min or less may be preferred.

Water

The cleaning compositions of the present invention comprise water. In the present invention, water functions in various ways such as, for example, to dissolve one or more solid components of the composition, as a carrier of the components, as an aid in the removal of the residue, as a viscosity modifier of the composition, and as a diluent. Preferably, the water employed in the cleaning composition is de-ionized (DI) water.

It is believed that, for most applications, water will comprise, for example, from about 15 to about 50% by wt. of water. Other embodiments of the present invention could comprise about 35 to about 50% by wt. of water. Other preferred embodiments of the present invention could comprise from about 20 to about 40% by wt. of water. Yet other preferred embodiments of the present invention could comprise from about 30 to about 35% by wt. of water. Still other preferred embodiments of the present invention could include water in an amount from about 32 to about 35% by weight or an amount effective to achieve the desired weight percent of the other ingredients.

Water-Miscible Organic Solvent

The cleaning composition of the present invention comprises one or more water-miscible organic solvent, wherein the water-miscible organic solvent is not an ether. In certain embodiments of the present invention, metal lines on the substrate typically dictate whether a water-miscible organic solvent is used. For example, when aluminum lines are present on a substrate, the combination of water and fluoride ion will typically tend to etch the aluminum. In such embodiments, the use of water-miscible organic solvent can significantly reduce, if not eliminate, etching of aluminum.

Examples of water-miscible organic solvents that can be used are ethylene glycol, propylene glycol, 1,4-butanediol, hexylene glycol, dimethylsulfoxide, dimethyl acetamide, tetrahydrofurfuryl alcohol, glycerol, alcohols, sulfoxides, or mixtures thereof.

Preferred water-miscible solvents include propylene glycol, glycerol, dimethyl acetamide, tetrahydrofuryl alcohol, ethylene glycol, hexylene glycol, and mixtures thereof. Dimethylacetamide, propylene glycol, glycerol, or combinations thereof are most preferable.

It is believed that, for most applications, the amount of water-miscible organic solvent will comprise from about 10 to 65% by weight of the composition or from about 20 to 65% by weight of the composition. In some embodiments, the solvent comprises from about 35 to about 55% by weight and, most especially, from about 45% to about 55% or from about 48 to about 52% by weight of water-miscible organic solvent by weight of the composition. In other preferred embodiments, the solvent comprises from about 10 to about 40% by weight, especially, from about 10 to about 35% by weight, and most especially, about 10 to about 30% by weight.

In the composition of the present invention, the water-miscible organic solvent functions primarily to dissolve organic residues.

The water-miscible solvent component of the compositions of the present invention does not include an ether solvent. In other words, ethers are not employed as the water-miscible solvent component of the compositions of the present invention.

Without wishing to be bound by theory, it is believed that ether solvents can damage the low-k layer. In particular, it is believed that ether solvents can penetrate the porous low-k dielectric layer making it difficult to remove from the low-k layer and increasing the dielectric constant. Thus, ether solvents can contaminate the porous low-k layer and adversely affect its insulation ability. In addition, ether solvents can adversely affect and increase the copper etch rate. Accordingly, upon use, the compositions of the present invention preferably do not increase the dielectric constant of the low-k dielectric layer more than 0.50 and the Cu etch rate does not exceed 4 Å/min.

Fluoride Ion

The cleaning composition of the present invention also comprises one or more sources of fluoride ion. Fluoride ion functions principally to assist in removing inorganic residues from the substrate. Preferred compounds that provide a fluoride ion source according to the present invention are ammonium fluoride and quaternary ammonium fluorides such as, for example, tetramethylammonium fluoride and tetrabutylammonium fluoride. A fluoride salt of an aliphatic primary, secondary or tertiary amine can be used. Examples of such amines are those having the formula:

$$R^1NR^2R^3R^4F$$

wherein $R^1$, $R^2$, $R^3$ and $R^4$ individually represent H or a $(C_1-C_4)$alkyl group. Typically, the total number of carbon atoms in the $R^1$, $R^2$, $R^3$ and $R^4$ groups is 12 carbon atoms or less.

In selecting the source of the fluoride ion, consideration should be given as to whether or not the source releases ions that would adversely affect the surface being cleaned. For example, in cleaning semiconductor elements, the presence of sodium or calcium ions in the cleaning composition can have an adverse effect on the surface of the element. In a preferred embodiment, the fluoride ion source is ammonium fluoride.

It is believed that the amount of the compound used as the source of the fluoride ion in the cleaning composition will, for most applications, comprise, about 0.01 to about 8% by weight or from about 0.01 to about 7% by weight of a solution 40% ammonium fluoride, or stoichiometric equivalent thereof. Preferably, the compound comprises from about 0.02 to about 8% by weight, more preferably from about 0.02 to about 6% by weight, still more preferably, about 1 to about 8% by weight, and most preferably, from about 0.025% to about 5% by weight of a solution of about 40% ammonium fluoride. In some embodiments, the composition will comprise about 0.01 to about 8% by weight or about 0.01 to about 7% by weight of a fluoride ion source, which may be provided by a 40% ammonium fluoride solution. Preferably, the compound comprises from about 0.02 to about 6% by weight of a fluoride ion source and, most preferably, from about 0.025% to about 5% or from about 0.04 to about 2.5% by weight of a fluoride ion source or from about 0.05 to about 15% by weight of a solution of 40% ammonium fluoride, most preferably, from about 0.0625% to about 12.5% or from about 0.1 to about 6.25% by weight of a solution of 40% ammonium fluoride. It should be understood that the amount of fluoride ion used will typically depend, however, on the particular substrate being cleaned. For example, in certain cleaning applications, the amount of the fluoride ion can be relatively high when cleaning substrates that comprise dielectric materials that have a high resistance to fluoride etching. Conversely, in other applications, the amount of fluoride ion should be relatively low, for example, when cleaning substrates that comprise dielectric materials that have a low resistance to fluoride etching.

pH/Buffer

The cleaning composition of the present invention preferably includes a buffering agent to control the pH of the composition, typically to within a range of from about 7 to about 10 or from about 7 to about 9, with the preferred pH range being between from about 8 to about 9 or from about 8.1 to about 10. There are various applications in which the use of buffering is advantageous, indeed even quite important because some applications exhibit a pH drift which can cause significant and undesirable variances in cleaning and substrate etching.

Buffering agents for use in the present invention typically comprise a weak acid and a soluble salt containing the conjugate base of the weak acid. For example, the buffering agent can comprise a weak organic monoacid and its conjugate base such as, for example, acetic acid and ammonium acetate. In other embodiments, the buffering agent may comprise an organic or inorganic base in combination with an organic diacid. Examples of suitable bases include: ammonium hydroxide, amines, and quaternary ammonium hydroxides. In semiconductor applications, it is preferred that the base not include metal ions, for example, sodium and potassium, because they tend to contaminate the substrate. Preferred bases are the amine compounds described herein and the preferred acids are the organic acides described herein. The amine compound and the organic acid compound together function as a buffer when present in amounts sufficient to form a buffer (i.e., when the molar ratio of the acid to the base is from 1:1 to 1:10).

Amine Compound

The cleaning composition of the present invention comprises an amine compound, which may include (1) at least one alkanolamine; (2) at least one aminopropylmorpholine; or (3) both of at least one alkanolamine and at least one aminopropylmorpholine.

In certain preferred embodiments of the present invention, the amine compound is at least one alkanolamine. Preferred alkanolamines include the lower alkanolamines which are primary, secondary and tertiary having from 1 to 5 carbon atoms. Examples of such alkanolamines include N-methylethanolamine (NMEA), monoethanolamine (MEA), diethanolamine, mono-, di- and triisopropanolamine, 2-(2-aminoethylamino)ethanol, 2-(2-aminoethoxy)ethanol, triethanolamine, N-ethyl ethanolamine, N,N-dimethylethanolamine, N,N-diethyl ethanolamine, N-methyl diethanolamine, N-ethyl diethanolamine, cyclohexylaminediethanol, and mixtures thereof.

In preferred embodiments, the amine compound is an alkanolamine selected from the group consisting of triethanolamine (TEA), diethanolamine, N-methyl diethanolamine, diisopropanolamine, monoethanol amine, amino (ethoxy) ethanol (AEE), N-methyl ethanol amine, monoisopropanol amine, cyclohexylaminediethanol, and mixtures thereof.

In other preferred embodiments of the present invention, the amine compound is aminopropylmorpholine. In such embodiments, an alkanolamine is typically not needed.

It is believed that the amount of the amine compound in the composition will, for the most applications, comprise from about 1% to about 50% by weight of the composition, specifically, about 8% to about 50% by weight of the composition, or more specifically, about 20% to about 50% by weight of the composition. In some embodiments, the amine compound comprises from about 2% to about 15% weight percent and, more specifically, from about 3 to about 12% or about from 3 to about from 7% by weight of the composition.

In addition to functioning as the base component of a buffer, any amine compound not reacted with an acid may also function to react with organic residue and chelate metals during the cleaning operation.

Organic Acid

The cleaning composition of the present invention also comprises one or more organic acid, which functions as a pH adjustor and, in some embodiments, as a buffer component.

Examples of organic acids may be aliphatic/aromatic carboxylic acids, amino carboxylic acid, sulfonic acids and aminosulfonic acid. Exemplary carboxylic acids include, but are not limited to, acetic acid, propionic acid, butyric acid, pentanoic acid, 3-methylbutanoic acid, hexanoic acid, heptanoic acid, octanoic acid, nonanoic acid, decanoic acid, dodecanoic acid, tridecanoic acid, tetradecanoic acid, pentadecanoic acid, hexadecanoic acid, heptadecanoic acid, octadecanoic acid, dodecanedioic acid, 2-methylheptanoic acid, 2-hexyldecanoic acid, oxalic acid, malonic acid, maleic acid, fumaric acid, succinic acid, itaconic acid, glutaric acid, adipic acid, malic acid, tartaric acid, acrylic acid, methacrylic acid, citric acid, lactic acid, glycolic acid, ascorbic acid, anthranilic acid, gallic acid, benzoic acid, isophthalic acid, phthalic acid, trimellitic acid, pyromellitic acid, salicylic acid, 2,4-dihydroxy benzoic acid and others. Exemplary amino carboxylic acids include, but are not limited to, glycine, dihydroxy ethyl glycine, alanine, valine, leucine, asparagine, glutamine, aspartic acid, glutaric acid, lysine, arginine, imino diacetic acid, nitrilo triacetic acid, ethylenediamine tetraacetic acid, 1,2-cyclohexadiamine tetraacetic acid, diethylene triamine pentaacetic acid, and others. Exemplary sulfonic/aminosulfonic acids include, but are not limited to, benzyl sulfonic acid, p-toluene sulfonic acid, 2-(N-morpholino)ethanesulfonic acid, N-(2-hydroxyethyl)piperazine-N'-(ethanesulfonic acid), 3-[N,N-bis(2-hydroxyethyl)amino]-2-hydroxypropanesulfonic acid, 4-(N-morpholino)butanesulfonic acid, N-(2-hydroxyethyl)piperazine-N'-(2-hydroxypropanesulfonic acid), N-(2-hydroxyethyl)piperazine-N'-(3-propanesulfonic acid), 2-(N-cyclohexylamino)ethanesulfonic acid, and mixtures thereof.

In preferred embodiments, the organic acid is selected from the group consisting of oxalic acid, malonic acid, citric acid, acetic acid, imiodiacetic acid, lactic acid, para-toluene sulfonic acid, gallic acid, ascorbic acid, and mixtures thereof.

It is believed that the amount of the organic acid in the composition will, for the most applications, comprise from about 1% to about 25% by weight or from about 1% to about 15% by weight of the composition. Preferably, the organic acid comprises from about 2% to about 12% weight percent, preferably from about 6 to about 10%, and, more preferably, from about 3 to about 10% or from about 2 to about 5% by weight of the composition.

Corrosion Inhibitors

The compositions of the present invention optionally comprise at least one corrosion inhibitor. Corrosion inhibitors serve to react with the substrate surface being cleaned, which may be a metal, particularly copper, or a nonmetal, to passivate the surface and prevent excessive etching during cleaning. In particular and without being bound to any particular theory, it is believed that the corrosion inhibitor forms a coating of an insoluble chelate compound on the copper surface, thus suppressing contact between the photoresist residue removal component and the metal thereby preventing corrosion.

Any corrosion inhibitor known in the art for similar applications, such as those disclosed in U.S. Pat. No. 5,417,877, which are incorporated herein by reference, may be used. The use of a corrosion-inhibitor is particularly preferred when the composition is used to clean a metallic substrate. Examples of corrosion-inhibitors include aromatic hydroxyl compounds, acetylenic alcohols, carboxyl group-containing organic compounds and anhydrides thereof, and triazole compounds.

Exemplary aromatic hydroxyl compounds include phenol, cresol, xylenol, pyrocatechol, resorcinol, hydroquinone, pyrogallol, 1.2.4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, amino resorcinol, p-hydroxybenzoic acid, o-hydroxybenzoic acid, 2,4-dihydroxybenzoic acid, 2-5-dihydroxybenzoic acid, 3,4-dihydroxybenzoic acid and 3,5-dihydroxybenzoic acid.

Exemplary acetylenic alcohols include 2-butyne-1,4-diol, 3,5-dimethyl-1-hexyn-3-ol, 2-methyl-3-butyn-2-ol, 3-methyl-1-pentyn-3-ol, 3,6-dimethyl-4-octyn-3,6-diol, 2,4-7,9-tetramethyl-5-decyne-4,7-diol and 2,5-dimethyl-3-hexyne 2,5-diol.

Exemplary carboxyl group-containing organic compounds and anhydrides thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, maleic acid, acetic anhydride and salicylic acid.

Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

In an exemplary embodiment, the corrosion inhibitors include one or more of benzotriazole, carboxybenzotriazole, amino-benzotriazole, D-fructose, catechol, t-butyl catechol, L-ascorbic acid, gallic acid, vanillin, salicylic acid, diethyl hydroxylamine, and poly(ethyleneimine).

Preferred copper corrosion inhibitors are selected from the group consisting of benzotriazole, amino-benzotriazole, L-ascorbic acid, gallic acid, vanillin, diethylhydroxylamine, and mixtures thereof.

It is believed that for most applications, the corrosion-inhibitor will comprise from about 0.1 wt. % to about 15 wt. % of the composition; preferably it comprises from about 0.1 wt. % to about 10 wt. %, preferably, from about 0.5 wt. % to about 5 wt. %, and most preferably, from about 0.1 wt. % to about 1 wt. % or about 0.5 wt. % to about 5 wt. % of the composition.

Other Optional Ingredients

The cleaning composition of the present invention may also include one or more of the following additives: surfactants, chelating agents, chemical modifiers, dyes, biocides, and other additives. The additive(s) may be added to the extent that they do not adversely affect the pH range of the composition.

Another optional ingredient that can be used in the cleaning composition is a metal chelating agent; it can function to increase the capacity of the composition to retain metals in solution and to enhance the dissolution of metallic residues. Typical examples of chelating agents useful for this purpose are the following organic acids and their isomers and salts: ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N,N'-tetraacetic acid (DHPTA), methyliminodiacetic acid, propylenediaminetetraacetic acid, nitrotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine. Preferred chelating agents are aminocarboxylic acids such as EDTA, CyDTA and aminophosphonic acids such as EDTMP.

It is believed that, for most applications, the chelating agent will be present in the composition in an amount of from about 0.1 wt. % to about 10 wt. %, preferably in an amount of from about 0.5 wt. % to about 5 wt. % of the composition.

Other commonly known components such as dyes, biocides etc. can be included in the cleaning composition in conventional amounts, for example, amounts up to a total of about 5 weight % of the composition.

When exposed to a substrate comprising a porous dielectric material, the cleaning compositions of the present invention do not substantially change the dielectric constant of the porous dielectric material. In this regard, when exposed to a substrate comprising a porous dielectric material, the cleaning compositions of the present invention preferably does not increase the material's dielectric constant by more than 0.35 and, preferably, not more than 0.25.

The cleaning composition of the present invention is typically prepared by mixing the components together in a vessel at room temperature until all solids have dissolved in the aqueous-based medium.

The cleaning composition of the present invention can be used to remove from a substrate undesired residue. It is believed that the composition can be used to particularly good advantage in cleaning a semiconductor substrate on which residue is deposited or formed during the process for manufacturing semiconductor devices; examples of such residue include resist compositions in the form of films (both positive and negative) and etching deposits formed during dry etching, as well as chemically degraded resist films. The use of the composition is particularly effective when the residue to be removed is a resist film and/or an etching deposit on a semiconductor substrate having a metal film-exposed surface. Examples of substrates that can be cleaned by use of the composition of the present invention without attacking the substrates themselves include metal substrates, for example: aluminum titanium/tungsten; aluminum/silicon; aluminum/silicon/copper; silicon oxide; silicon nitride; and gallium/arsenide. Such substrates typically include residues comprising photoresists and/or post etch deposits.

In addition to being effective when used to remove resist films and/or etching residues on a semiconductor wafer having an exposed surface of a metal film, the cleaning composition is especially effective when the metal film is made of copper or a copper alloy containing copper as the main component and also when a low-dielectric film is used as an interlayer insulating film. An example of a copper alloy containing copper as the main component is one containing 90% by weight or more copper, and other elements, for example, Sn, Ag, Mg, Ni, Co, Ti, Si, and Al. Since these metals have low resistances and improve the high-speed operation of elements, but are easily dissolved or corroded by chemicals, the "non-corrosive" properties of the composition of the present invention are significant.

The cleaning composition can be used to remove post-etch and ash, other organic and inorganic residues as well as polymeric residues from semiconductor substrates at relatively low temperatures with little corrosive effect. The cleaning composition should be applied to the surface for a period of time to sufficient to obtain the desired cleaning effect. The time will vary depending on numerous factors, including, for example, the nature of the residue the temperature of the cleaning composition and the particular cleaning composition used. In general, the cleaning composition can be used, for example, by contacting the substrate at a temperature of from about 25° C. to about 85° C. for a period of time ranging from about 1 minute to about 1 hour followed by rinsing the cleaning composition from the substrate and drying the substrate.

The contacting step can be carried out by any suitable means such as, for example, immersion, spray, or via a single wafer process; any method that utilizes a liquid for removal of photoresist, ash or etch deposits and/or contaminants can be used.

The rinsing step is carried out by any suitable means, for example, rinsing the substrate with de-ionized water by immersion or spray techniques. In some embodiments, the rinsing step is carried out employing a mixture of de-ionized water and a water-miscible organic solvent such as, for example, isopropyl alcohol.

The drying step is carried out by any suitable means, for example, isopropyl alcohol (IPA) vapor drying or by centripetal force.

It will be appreciated by those skilled in the art that the cleaning composition of the present invention may be modified to achieve optimum cleaning without damaging the substrate so that high throughput cleaning can be maintained in the manufacturing process. For example, one skilled in the art would appreciate that, for example, modifications to the amounts of some or all of the components may be made depending upon the composition of the substrate being cleaned, the nature of the residue to be removed, and the particular process parameters used.

In another embodiment of the present invention is provided a replenishment composition for the cleaning composition of this invention. As the cleaning composition is used to clean semiconductor substrates the cleaning composition is partially removed from the container or bath that holds the cleaning composition with each of the substrates that are contacted with the cleaning composition. The cleaning composition is typically used to clean a plurality of substrates that are serially and/or simultaneously and/or both serially and simultaneously (in the case of batches of substrates that contacted with the cleaning composition followed by one or a plurality of batches) and then replaced with a fresh quantity of the cleaning composition. The substrates are contacted with the cleaning composition by, for example, spraying the one or more substrates with the cleaning composition and/or dipping the one or more substrates into a bath containing the cleaning composition. The tool used to clean the substrates may be for examples, a spray solvent tool, a wet bench tool or a single wafer tool. Additionally, typically the method further comprises the step of heating the cleaning composition ambient temperature to, for example, a temperature between from about 25 or 85° C. or from about 25 to about 45° C. prior to and/or when contacting the one or more substrates. The heating of the cleaning composition causes the components of the cleaning composition to evaporate. The rate of the evaporation of each of the components is typically a function of the boiling points of each of the components thereby causing the ratio of the components in the cleaning composition to change over time. It has been determined for the cleaning compositions of this invention that it may be beneficial to add a replenishment composition to cleaning composition after it has cleaned a set number of substrates or after a certain period of time or upon measurement of a variable characteristic of the cleaning composition that is related to the change in the ratio of the components in the cleaning composition. Examples of the variables that may be measured and used to determine if it is time to add the replenishment composition to the cleaning composition include: the pH or cleaning efficiency or substrate etch rates of the composition or the level of the cleaning composition in the bath.

For the cleaning compositions of this invention that comprise: a) from about 15% to about 50% by weight of water; b) from about 10% to about 65% by weight or from about 20% to about 65% by weight of a water-miscible organic solvent, wherein the water-miscible organic solvent is not an ether; c) from about 1% to about 50% by weight or from about 1% to about 20% by weight of an amine compound selected from the group consisting of at least one alkanolamine and at least one aminopropylmorpholine; d) from about 1% to about 25% by weight or from about 1% to about 15% by weight of at least one organic acid; and e) from about 0.01% to about 8% by weight or from about 0.01% to about 7% by weight of a fluoride ion source, the replenishment composition may comprise: a) from about 20% to about 84% by weight of water; b) from about 15% to about 40% by weight of a water-miscible organic solvent, wherein the water-miscible organic solvent is not an ether; and c) from about 1% to about 5% by weight of an amine compound selected from the group consisting of at least one alkanolamine and at least one aminopropylmorpholine. In some embodiments, if the cleaning composition further comprises from about 1% to about 15% by weight of diethylhydroxylamine, the replenishment composition may further comprise d) from about 4% to about 35% by weight of diethylhydroxylamine, and said water is present in said replenishment composition between from about 20% to about 80% by weight.

The method may further comprise the steps of rinsing the cleaning composition from the semiconductor substrate; and drying the semiconductor substrate, wherein the semiconductor substrate comprises a porous dielectric material having a dielectric constant; and wherein after said contacting, rinsing and drying steps the dielectric constant of the porous dielectric material does not increase more than 0.50, or does not increase more than 0.25.

The preferred components used to form the cleaning compositions are the same preferred components for use in the replenishment composition as described above for the cleaning composition. The replenishment compositions will comprise the same components, although typically fewer components than the cleaning composition to which it is added and typically the ratios for the components in the cleaning composition will differ from the ratios of the components in the replenishment composition. The exact preferred components and the ratios of the components in the replenishment composition will be a function of the rate of loss of each particular component either by its removal with the substrate (e.g. from the bath) upon completion of the contacting step or due to its evaporation from the composition relative to the other components' evaporation.

In one embodiment, the replenishment composition is added to the cleaning composition by periodic addition to the bath, for example, via a nozzle. A level sensor may be used to determine how much replenishment composition to add to the bath. The replenishment composition may be added after each substrate or after each batch of a plurality of substrates are cleaned by contacting them with the cleaning composition. However, after a set number of substrates have been treated, by the cleaning composition, the entire bath may require that the cleaning composition be discarded and replaced with fresh cleaning composition, and the process of contacting and adding can be repeated. The intervals for adding the replenishment composition to the cleaning composition and replacing the entire cleaning composition will vary depending upon the temperature of the cleaning composition, the substrates to be cleaned, and the residues and can be determined by a person of skill in the art. Although the present invention has been principally described in connection with cleaning semiconductor substrates, the cleaning compositions of the invention can be employed to clean any substrate that includes organic and inorganic residues.

EXAMPLES

The following examples are provided for the purpose of further illustrating the present invention but are by no means intended to limit the same.

General Procedure for Preparing the Cleaning Compositions

All compositions which are the subject of the present Examples were prepared by mixing 500 g of material in a 600 mL beaker with a 1" Teflon-coated stir bar.

Compositions of the Substrate

Each substrate used in the present Examples comprised an organosilicate glass (OSG) dielectric material with a titanium nitride capping layer that was deposited on a silicon nitride substrate. The OSG was etched by reactive ion etching (RIE) to leave behind OSG lines capped with titanium nitride. Following RIE, the substrates were treated in a plasma to ash the photoresist.

Processing Conditions

Cleaning tests were run using 305 mL of the cleaning compositions in a 400 mL beaker with a ½" round Teflon stir bar set at 600 rpm. The cleaning compositions were heated to the desired temperature indicated below on a hot plate if necessary. Wafer segments approximately ½"×½" in size were immersed in the compositions under the following set of conditions.

10 minutes @ 25° C.
20 minutes @ 25° C.
10 minutes @ 35° C.
20 minutes @ 35° C.

The segments were then rinsed for 3 minutes in a DI water overflow bath and subsequently dried using filtered nitrogen. They were then analyzed for cleanliness using SEM microscopy.

Etch Rate Measurement Procedure

Coupons of the blanket Al or blanket Cu wafers were measured for metal layer thickness by measuring the resistivity of the layer by employing a ResMap™ model 273 resistivity instrument from Creative Design Engineering, Inc. The coupons were then immersed in the composition at the desired temperature for up to one hour. Periodically the coupons were removed from the composition, rinsed with de-ionized water and dried and the thickness of the metal layer was again measured. A graph of the change in thickness as a function of immersion time was made and the etch rate in Angstroms/min was determined from the slope of the curve.

The following Tables identify the components of the compositions tested and referenced below.

| Comparative Example A | wt % |
|---|---|
| Dimethyl acetamide | 39.15 |
| DIW | 49.75 |
| Ammonium Acetate | 2.60 |
| Acetic Acid | 2.00 |
| Ammonium fluoride | 0.5 |
| Propylene glycol | 6.00 |

| 92A | wt % |
|---|---|
| DIW | 34.66 |
| Glycerol | 22.80 |
| Propylene glycol | 22.90 |
| N,N-diethylhydroxylamine | 8.08 |
| Lactic acid (88% sol) | 7.20 |
| Ammonium fluoride | 0.56 |
| Monoethanol amine | 3.80 |

| 94W | wt % |
|---|---|
| DIW | 27.15 |
| Propylene glycol (PG) | 34.00 |
| N,N-diethylhydroxylamine (DEHA) | 4.25 |
| ethanolamine (MEA) | 17.00 |
| Acetic Acid | 16.00 |
| Ammonium fluoride (NH4F) | 1.60 |

| 95O | wt % |
|---|---|
| DIW | 30.86 |
| PG | 45.70 |
| N,N-diethylhydroxylamine | 8.08 |
| Monoethanol amine | 3.80 |
| Paratoluene sulfonic acid | 11.00 |
| Ammonium fluoride | 0.56 |

| 94V | wt % |
|---|---|
| DIW | 26.40 |
| Propylene glycol (PG) | 39.00 |
| ethanolamine (MEA) | 17.00 |
| Acetic Acid | 16.00 |
| Ammonium fluoride (NH4F) | 1.60 |

| 95V | wt % |
|---|---|
| DIW | 31.30 |
| Propylene glycol | 45.70 |
| N,N-diethylhydroxylamine | 8.08 |
| Monoethanol amine | 3.80 |
| Paratoluene sulfonic acid | 11.00 |
| Ammonium fluoride | 0.12 |

| 95W | wt % |
|---|---|
| DIW | 31.30 |
| Propylene glycol | 23.00 |
| Dimethyl acetamide | 22.70 |
| N,N-diethylhydroxylamine | 8.08 |
| Monoethanol amine | 3.80 |
| Paratoluene sulfonic acid | 11.00 |
| Ammonium fluoride | 0.12 |

| 96A | wt % |
|---|---|
| DIW | 34.3 |
| Propylene glycol (PG) | 49.3 |
| ethanolamine (MEA) | 8.5 |
| Malonic Acid | 6.7 |
| Ammonium fluoride (NH4F) | 1.2 |

| 96R | wt % |
|---|---|
| DIW | 34.3 |
| Propylene glycol (PG) | 46.3 |
| ethanolamine (MEA) | 8.5 |
| Malonic Acid | 6.7 |
| Ammonium fluoride (NH4F) | 1.2 |
| glycine | 3 |

| 96W | wt % |
|---|---|
| DIW | 33.8 |
| Propylene glycol | 47.3 |
| Monoethanol amine | 8.3 |
| Malonic Acid | 6.7 |
| Ammonium fluoride | 0.9 |
| glycine | 3.0 |

| 97L | wt % |
|---|---|
| DIW | 34.66 |
| Propylene glycol | 47.30 |
| Monoethanol amine | 8.30 |
| Malonic Acid | 6.70 |
| glycine | 3.00 |
| Ammonium fluoride | 0.04 |

| 99U | wt % |
|---|---|
| DIW | 30.86 |
| Propylene glycol | 42.70 |
| Glycerol | 3.00 |
| N,N-diethylhydroxylamine | 8.08 |
| Monoethanol amine | 3.80 |
| Paratoluene sulfonic acid | 11.00 |
| Ammonium fluoride | 0.56 |

| 99V | wt % |
|---|---|
| DIW | 34.66 |
| Propylene glycol | 45.70 |
| N,N-diethylhydroxylamine | 8.08 |
| Monoethanol amine | 3.80 |
| Lactic acid (88% sol) | 7.20 |
| Ammonium fluoride | 0.56 |

| 99P | wt % |
|---|---|
| DIW | 41.32 |
| Glycerol | 44.75 |
| Aminoethoxyethanol | 8.3 |
| citric acid | 4.75 |
| Ammonium fluoride | 0.88 |

| 100A | wt % |
|---|---|
| DIW | 34.26 |
| Propylene glycol (PG) | 50.80 |
| N,N-diethylhydroxylamine (DEHA) | 8.08 |
| ethanolamine (MEA) | 3.50 |
| malonic acid | 2.80 |
| Ammonium fluoride (NH4F) | 0.56 |

| 100B | wt % |
|---|---|
| DIW | 34.26 |
| Propylene glycol (PG) | 50.30 |
| N,N-diethylhydroxylamine (DEHA) | 8.08 |
| ethanolamine (MEA) | 3.40 |
| citric acid | 3.40 |
| Ammonium fluoride (NH4F) | 0.56 |

| 100C | wt % |
|---|---|
| DIW | 34.26 |
| Propylene glycol (PG) | 50.60 |
| N,N-diethylhydroxylamine (DENA) | 8.08 |
| ethanolamine (MEA) | 3.40 |
| acetic acid | 3.10 |
| Ammonium fluoride (NH4F) | 0.56 |

| 100D | wt % |
|---|---|
| DIW | 34.26 |
| Propylene glycol (PG) | 53.95 |
| N,N-diethylhydroxylamine (DEHA) | 8.08 |
| ethanolamine (MEA) | 1.75 |
| malonic acid | 1.40 |
| Ammonium fluoride (NH4F) | 0.56 |

| 100E | wt % |
|---|---|
| DIW | 34.26 |
| Propylene glycol (PG) | 53.70 |
| N,N-diethylhydroxylamine (DEHA) | 8.08 |
| ethanolamine (MEA) | 1.70 |
| citric acid | 1.70 |
| Ammonium fluoride (NH4F) | 0.56 |

| 100F | wt % |
|---|---|
| DIW | 34.26 |
| Propylene glycol (PG) | 53.85 |
| N,N-diethylhydroxylamine (DEHA) | 8.08 |
| ethanolamine (MEA) | 1.70 |
| acetic acid | 1.55 |
| Ammonium fluoride (NH4F) | 0.56 |

| 100J | wt % |
|---|---|
| DIW | 34.26 |
| Propylene glycol (PG) | 42.80 |
| N,N-diethylhydroxylamine (DEHA) | 8.08 |
| Cyclohexyldiethanol Amine | 11.50 |
| malonic acid | 2.80 |
| Ammonium fluoride (NH4F) | 0.56 |

| 100K | wt % |
|---|---|
| DIW | 42.26 |
| N,N-diethylhydroxylamine (DEHA) | 8.08 |
| Cyclohexyldiethanol amine | 39.1 |
| malonic acid | 10 |
| Ammonium fluoride (NH4F) | 0.56 |

| 100L | wt % |
|---|---|
| DIW | 32.26 |
| N,N-diethylhydroxylamine (DEHA) | 8.08 |
| Cyclohexyldiethanolamine | 47.10 |
| malonic acid | 12.00 |
| Ammonium fluoride (NH4F) | 0.56 |

| 103A | wt % |
|---|---|
| DIW | 34.26 |
| Propylene glycol (PG) | 14.10 |
| N,N-diethylhydroxylamine | 8.08 |
| Diethanolamine | 30.00 |
| acetic acid | 13.00 |
| Ammonium fluoride | 0.56 |

| 103B | wt % |
|---|---|
| DIW | 32.43 |
| Propylene glycol (PG) | 9.87 |
| Diethanolamine (DEA) | 42.08 |

-continued

| 103B | wt % |
|---|---|
| acetic acid | 15.05 |
| Ammonium fluoride | 0.57 |

| 103C | wt % |
|---|---|
| DIW | 34.26 |
| Propylene glycol (PG) | 14.10 |
| N,N-diethylhydroxylamine | 8.08 |
| Diethanolamine | 30.00 |
| Malonic acid | 13.00 |
| Ammonium fluoride | 0.56 |

| 106A | wt % |
|---|---|
| DIW | 34.26 |
| Propylene glycol (PG) | 10 |
| N,N-diethylhydroxylamine | 8.08 |
| Diethanolamine (DEA) | 30 |
| citric acid | 17.1 |
| Ammonium fluoride | 0.56 |

| 106B | wt % |
|---|---|
| DIW | 34.26 |
| Propylene glycol (PG) | 11.35 |
| N,N-diethylhydroxylamine | 8.08 |
| Diethanolamine (DEA) | 30 |
| citric acid | 15.75 |
| Ammonium fluoride | 0.56 |

| 112A | wt % |
|---|---|
| DIW | 34.26 |
| Propylene glycol (PG) | 47.8 |
| N,N-diethylhydroxylamine (DEHA) | 8.08 |
| Diethanolamine (DEA) | 6.5 |
| Malonic acid | 2.8 |
| Ammonium fluoride | 0.56 |

| 112B | wt % |
|---|---|
| DIW | 34.26 |
| Propylene glycol (PG) | 52.40 |
| N,N-diethylhydroxylamine (DEHA) | 8.08 |
| Diethanolamine (DEA) | 3.20 |
| acetic acid | 1.50 |
| Ammonium fluoride | 0.56 |

| 112C | wt % |
|---|---|
| DIW | 34.26 |
| Propylene glycol (PG) | 47.30 |
| N,N-diethylhydroxylamine (DEHA) | 8.08 |

| 112C | wt % |
|---|---|
| Diethanolamine (DEA) | 6.40 |
| citric acid | 3.40 |
| Ammonium fluoride | 0.56 |

| 101A | wt % |
|---|---|
| DIW | 40.71 |
| Propylene glycol (PG) | 44.75 |
| Aminoethoxyethanol | 8.90 |
| citric acid | 4.76 |
| Ammonium fluoride | 0.88 |

| 101C | wt % |
|---|---|
| DIW | 41.32 |
| Propylene glycol (PG) | 42.80 |
| Diethanolamine (DEA) | 10.00 |
| citric acid (anhydrous) | 5.00 |
| Ammonium fluoride | 0.88 |

| 115A | wt % |
|---|---|
| DIW | 41.32 |
| Propylene glycol (PG) | 27.80 |
| Diethanolamine (DEA) | 20.00 |
| citric acid | 10.00 |
| Ammonium fluoride | 0.88 |

| 115B | wt % |
|---|---|
| DIW | 41.32 |
| Propylene glycol (PG) | 12.80 |
| Diethanolamine (DEA) | 30.00 |
| citric acid | 15.00 |
| Ammonium fluoride | 0.88 |

| 110A | wt % |
|---|---|
| DIW | 33.94 |
| Propylene glycol (PG) | 10.00 |
| N,N-diethylhydroxylamine (DEHA) | 8.08 |
| Diethanolamine (DEA) | 32.10 |
| acetic acid | 15.00 |
| Ammonium fluoride | 0.88 |

| 112E | wt % |
|---|---|
| DIW | 33.94 |
| Propylene glycol (PG) | 45.30 |
| N,N-diethylhydroxylamine (DEHA) | 8.08 |
| N-methyldiethanolamine (MDEA) | 8.40 |
| citric acid | 3.40 |
| Ammonium fluoride | 0.88 |

| 112F | wt % |
|---|---|
| DIW | 33.94 |
| Propylene glycol (PG) | 45.9 |
| N,N-diethylhydroxylamine (DEHA) | 8.08 |
| N-methyldiethanolamine (MDEA) | 8.40 |
| Malonic acid | 2.80 |
| Ammonium fluoride | 0.88 |

| 113 | wt % |
|---|---|
| DIW | 32.86 |
| Propylene glycol (PG) | 34.9 |
| Triethanolamine (TEA) | 10 |
| Ethanolamine (MEA) | 11 |
| Malonic acid | 10.68 |
| Ammonium fluoride | 0.56 |

| 114 | wt % |
|---|---|
| DIW | 29.84 |
| Propylene glycol (PG) | 38 |
| Triethanolamine (TEA) | 10 |
| Ethanolamine (MEA) | 10 |
| citric acid | 9.63 |
| Malonic acid | 1.65 |
| mmonium fluoride | 0.88 |

| 115 | wt % |
|---|---|
| DIW | 29.72 |
| Propylene glycol (PG) | 36.8 |
| Triethanolamine (TEA) | 10 |
| Ethanolamine (MEA) | 11 |
| citric acid | 11.6 |
| Ammonium fluoride | 0.88 |

| Comparative Example B | wt % |
|---|---|
| Water | 41.76 |
| Penta methyl diethyleneamine | 13.88 |
| Triethanol amine | 33.62 |
| Iminodiacetic acid | 3.07 |
| Ammonium Bifluoride | 7.67 |

| 52J | wt % |
|---|---|
| DIW | 40.52 |
| Glycerol | 15 |
| Triethanolamine (TEA) | 32.5 |
| citric acid | 7.98 |
| Ammonium fluoride | 4 |

| 52Q | wt % |
|---|---|
| DIW | 37.81 |
| Glycerol | 14.27 |

-continued

| 52Q | wt % |
|---|---|
| Triethanolamine (TEA) | 37.38 |
| citric acid | 7.14 |
| Ammonium fluoride | 3.4 |

| 52L | wt % |
|---|---|
| DIW | 41.52 |
| Glycerol | 10 |
| Triethanolamine (TEA) | 32.5 |
| citric acid | 7.98 |
| Ammonium fluoride | 8 |

| 56D | wt % |
|---|---|
| DIW | 45.09 |
| Glycerol | 27.3 |
| Triethanolamine (TEA) | 10 |
| Aminoethoxyethanol (AEE) | 10 |
| citric acid | 6.73 |
| Ammonium fluoride | 0.88 |

| 56S | wt % |
|---|---|
| DIW | 46.01 |
| Glycerol | 27.3 |
| Triethanolamine (TEA) | 8.5 |
| Aminoethoxyethanol (AEE) | 10.2 |
| citric acid | 7.11 |
| Ammonium fluoride | 0.88 |

| 56U | wt % |
|---|---|
| DIW | 46.79 |
| Glycerol | 23.4 |
| Triethanolamine (TEA) | 8.5 |
| Aminoethoxyethanol (AEE) | 10.2 |
| citric acid | 7.11 |
| Ammonium fluoride | 4 |

| 56O | wt % |
|---|---|
| DIW | 45.87 |
| Glycerol | 23.4 |
| Triethanolamine (TEA) | 10 |
| Aminoethoxyethanol (AEE) | 10 |
| citric acid | 6.73 |
| Ammonium fluoride | 4 |

| 1A | wt % |
|---|---|
| DIW | 40.55 |
| Glycerol | 32.76 |
| Triethanolamine (TEA) | 8.5 |
| Aminoethoxyethanol (AEE) | 10.2 |
| citric acid | 7.11 |
| Ammonium fluoride | 0.88 |

| 2A | wt % |
|---|---|
| DIW | 45.78 |
| Glycerol | 27.16 |
| Triethanolamine (TEA) | 8.46 |
| Aminoethoxyethanol (AEE) | 10.15 |
| citric acid | 7.07 |
| Ammonium fluoride | 0.88 |
| Benzotriazole | 0.5 |

| 2C | wt % |
|---|---|
| DIW | 45.78 |
| Glycerol | 27.16 |
| Triethanolamine (TEA) | 8.46 |
| Aminoethoxyethanol (AEE) | 10.15 |
| citric acid | 7.07 |
| Ammonium fluoride | 0.88 |
| Carboxybenzotriazole | 0.5 |

| 2N | wt % |
|---|---|
| DIW | 45.78 |
| Glycerol | 27.16 |
| Triethanolamine (TEA) | 8.46 |
| Aminoethoxyethanol (AEE) | 10.15 |
| citric acid | 7.07 |
| Ammonium fluoride | 0.88 |
| Amino-benzotriaole | 0.5 |

| 2E | wt % |
|---|---|
| DIW | 45.78 |
| Glycerol | 27.16 |
| Triethanolamine (TEA) | 8.46 |
| Aminoethoxyethanol (AEE) | 10.15 |
| citric acid | 7.07 |
| Ammonium fluoride | 0.88 |
| D-Fructose | 0.5 |

| 2F | wt % |
|---|---|
| DW | 45.78 |
| Glycerol | 27.16 |
| Triethanolamine (TEA) | 8.46 |
| Aminoethoxyethanol (AEE) | 10.15 |
| citric acid | 7.07 |
| Ammonium fluoride | 0.88 |
| Catechol | 0.5 |

| 2G | wt % |
|---|---|
| DIW | 45.78 |
| Glycerol | 27.16 |
| Triethanolamine (TEA) | 8.46 |
| Aminoethoxyethanol (AEE) | 10.15 |
| citric acid | 7.07 |
| Ammonium fluoride | 0.88 |
| t-Butyl catechol | 0.5 |

| 2H | wt % |
|---|---|
| DIW | 45.78 |
| Glycerol | 27.16 |
| Triethanolamine (TEA) | 8.46 |
| Aminoethoxyethanol (AEE) | 10.15 |
| citric acid | 7.07 |
| Ammonium fluoride | 0.88 |
| L-Ascorbic acid | 0.5 |

| 2I | wt % |
|---|---|
| DIW | 45.78 |
| Glycerol | 27.16 |
| Triethanolamine (TEA) | 8.46 |
| Aminoethoxyethanol (AEE) | 10.15 |
| citric acid | 7.07 |
| Ammonium fluoride | 0.88 |
| Gallic acid | 0.5 |

| 2J | wt % |
|---|---|
| DIW | 45.78 |
| Glycerol | 27.16 |
| Triethanolamine (TEA) | 8.46 |
| Aminoethoxyethanol (AEE) | 10.15 |
| citric acid | 7.07 |
| Ammonium fluoride | 0.88 |
| Vanillin | 0.5 |

| 2K | wt % |
|---|---|
| DIW | 45.78 |
| Glycerol | 27.16 |
| Triethanolamine (TEA) | 8.46 |
| Aminoethoxyethanol (AEE) | 10.15 |
| citric acid | 7.07 |
| Ammonium fluoride | 0.88 |
| Salicylic acid | 0.5 |

| 2L | wt % |
|---|---|
| DIW | 45.78 |
| Glycerol | 27.16 |
| Triethanolamine (TEA) | 8.46 |
| Aminoethoxyethanol (AEE) | 10.15 |
| citric acid | 7.07 |
| Ammonium fluoride | 0.88 |
| Diethylhydroxylamine | 0.5 |

| 2M | wt % |
|---|---|
| DIW | 45.78 |
| Glycerol | 27.16 |
| Triethanolamine (TEA) | 8.46 |
| Aminoethoxyethanol (AEE) | 10.15 |
| citric acid | 7.07 |
| Ammonium fluoride | 0.88 |
| Poly(ethyleneimine) (P3143) | 0.5 |

| 7A | wt % |
|---|---|
| DIW | 40.96 |
| Glycerol | 10 |
| Triethanolamine (TEA) | 32.5 |
| citric acid | 7.54 |
| Ammonium fluoride | 8 |
| L-Ascorbic acid | 1 |

| 7B | wt % |
|---|---|
| DIW | 39.68 |
| Glycerol | 10 |
| Triethanolamine (TEA) | 32.5 |
| citric acid | 6.82 |
| Ammonium fluoride | 8 |
| L-Ascorbic acid | 1 |

| 7C | wt % |
|---|---|
| DIW | 40.96 |
| Glycerol | 10 |
| Triethanolamine (TEA) | 32.5 |
| citric acid | 7.54 |
| Ammonium fluoride | 8 |
| gallic acid | 1 |

| 7D | wt % |
|---|---|
| DIW | 39.68 |
| Glycerol | 10 |
| Triethanolamine (TEA) | 32.5 |
| citric acid | 6.82 |
| Ammonium fluoride | 8 |
| Gallic acid | 3 |

The following tables summarize the copper etch rate (E/R) data:

| Product/Formulation | 5% pH | Cu E/R (Å/min) |
|---|---|---|
| 52J | 7.81 | 2.4 |
| 52Q | 8.00 | 2.3 |
| 52L | 7.81 | 2.8 |
| 56D | 8.38 | 4.0 |
| 56S | 8.23 | 1.8 |
| 56U | 8.14 | 2.3 |
| 56O | 8.46 | 2.3 |
| E00201-1A | 8.21 | 1.2 |

| Product/Formulation | 5% pH | Cu E/R (Å/min) |
|---|---|---|
| 2A | 8.22 | 0.3 |
| 2C | 8.16 | 5.5 |
| 2N | 8.33 | 1.7 |
| 2E | 8.26 | 4.6 |
| 2F | 8.23 | 6.3 |
| 2G | 8.23 | 4.6 |
| 2H | 8.15 | 3 |
| 2I | 8.16 | 4.2 |
| 2J | 8.14 | 3.7 |

-continued

| Product/Formulation | 5% pH | Cu E/R (Å/min) |
|---|---|---|
| 2K | 8.22 | 6.6 |
| 2L | 8.3 | 3.2 |
| 2M | 8.4 | 5.9 |
| 7A | 7.79 | 1.8 |
| 7B | 7.76 | 1.5 |
| 7C | 7.78 | 1.6 |
| 7D | 7.77 | 2.0 |

As is evident, a number of the formulations tested exhibit an excellent copper etch rate. A lower Cu E/R value evidences a better copper etch rate. In particular, compositions providing a copper etch rate of 4 Å/min or less, 3 Å/min or less, or 2 Å/min or less are preferred.

Comparative Examples

Use of Ether Solvent Showing Increase in Cu Etch Rate

As comparative examples, two of the examples provided above, 52J and 56S, were evaluated by replacing a portion or all of the glycerol with an ether, dipropylene glycol monomethyl ether (DPM). The compositions remained otherwise identical.

| Product | Formulation | Cu E/R (Å/min) |
|---|---|---|
| 52J | As above | 2.4 |
| Comp-69A | 52J replacing all glycerol with DPM (15 wt %) | 5.8 |
| Comp-69B | 52J replacing half of glycerol with DPM (7.5 wt %) | 4.4 |
| 56S | As above | 1.8 |
| Comp-69C | 56S replacing all glycerol with DPM (15 wt %) | 47.7 |
| Comp-69D | 56S replacing half of glycerol with DPM (7.5 wt %) | 26.3 |

These results demonstrate that the Cu E/R significantly increased when a portion or all of the glycerol was replaced with DPM (an ether solvent). Thus, these results suggest that an ether solvent can produce an adverse impact on the copper etch rate when employed in the compositions disclosed herein.

Procedure: Film Loss Measurements

1. Measure the thickness before chemical immersion.
2. Immersion test was carried out in beaker with magnetic stir agitation (500 rpm) at 35 C for 15 mins.
3. Chemical immersion was followed by 3 minutes DI rinse and N2 blow dry.
4. Measure the thickness after chemical immersion.
5. Film loss=Step 4−Step 1

An ellipsometer for SiN and TEOS thickness measurements and a 4 point probe for Cu was employed to make the measurements as summarized in the Table below.

| | Ellipsometer | 4 Point Probe |
|---|---|---|
| Company | SCI (Scientific Computing International) | CDE (Creative Design Engineering) |
| Model | FilmTek 2000SE | ResMap 273 |

Results of Film Loss

| | 100A | 100B | 100C | 100D | 100E | 100F |
|---|---|---|---|---|---|---|
| Cu | 23.6 | 79.4 | 77.4 | 28.9 | 113.4 | 88.2 |
| SiN | 2.7 | 2.06 | 0.95 | 1 | 7.02 | 4.87 |
| TEOS | 0.3 | 1 | 0.3 | 0.3 | 1.3 | 1 |

Note:
1. Film loss in Å was measured after 15 mins in each cleaning composition at 35° C.

| Formulations | pH in 5% solution | Cu loss @ 35 C./15 min, Å | TEOS (undoped and undensified) loss @ 35 C./15 min, Å |
|---|---|---|---|
| 112A | 8.16 | 24 | 15 |
| 112B | 8.36 | 118 | <1 |
| 112C | 8.22 | 89 | <1 |
| 112E | 8.31 | 76 | 10 |
| 101A | 8.20 | 165 | 14 |
| 101C | 8.30 | 191 | <1 |
| 115A | 8.21 | 126 | 21 |
| 115B | 8.13 | 72 | 16 |
| 103C | 8.22 | 17 | 17 |
| 106B | 8.27 | 61 | 9 |
| 110A | 8.37 | 15 | 14 | pH Stability
pH measured is a 5% aqueous solution of the formulations

| | Day 1 | Day 2 | Day 3 | Day 4 | Day 5 | Day 8 |
|---|---|---|---|---|---|---|
| 100A | 8.22 | 8.19 | 8.25 | 8.22 | 8.23 | 8.29 |
| 100B | 8.24 | 8.32 | 8.35 | 8.31 | 8.3 | 8.31 |
| 100C | 8.21 | 8.28 | 8.26 | 8.24 | 8.24 | 8.31 |
| 100D | 8.28 | 8.32 | 8.34 | 8.33 | 8.34 | 8.32 |
| 100E | 8.16 | 8.25 | 8.22 | 8.27 | 8.28 | 8.26 |
| 100F | 8.44 | 8.48 | 8.41 | 8.45 | 8.45 | 8.45 |

Compare with conventional low pH fluoride stripper Comparative Example A, Example 95O showed much lower film loss on dielectric blankets.

Dielectric Film Loss Test

| Comp. Ex. A (@ 25 C.) | 53.5 | 57.1 | 39 | 59 |
|---|---|---|---|---|
| Example 95O (@ 35 C.) | 3.7 | 2.7 | 4.4 | 7.6 | unit: Å, 15 mins time frame

The dielectric constant of each sample film was determined according to ASTM Standard D150-98. The capacitance-voltage of each film were obtained at 1 MHz with a Solartron Model SI 1260 Frequency Analyzer and MSI Electronics Model Hg 401 single contact mercury probe. The error in capacitance measurements and mercury electrode area (A) was less than 1%. The substrate (wafer) capacitance ($C_{Si}$), background capacitance ($C_b$) and total capacitance ($C_T$) were measured between +20 and −20 volts and the thin film sample capacitance (CO was calculated by Equation (1):

$$C_s = C_{Si}(C_T - C_b)/[C_{Si} - (C_T - C_b)] \quad \text{Equation (1)}$$

The dielectric constant of each film was calculated by Equation (2) wherein d is the film thickness, A is the mercury electrode area, and $\varepsilon_0$ is the dielectric constant in vacuum:

$$\varepsilon = \frac{C_s d}{\varepsilon_0 A} \quad \text{Equation (2)}$$

The total error of the dielectric constant of the film was expected to be less than 6%.

K shift of 95O was lower than Comparable Example B on 40/45 nm dielectric film. The results are in the following table.

K Shift of Comparable Example B and Example 95O

|  | 270 sec | 270 sec | 15 mins | 15 mins |
|---|---|---|---|---|
| Comp. Example B (40 C.) | | | | |
| Before | 2.73 | 2.71 | 2.71 | 2.74 |
| After | 3.05 | 3.07 | 3.12 | 3.15 |
| Delta K | 0.32 | 0.36 | 0.41 | 0.41 |
| Example 95O (35 C.) | | | | |
| Before | 2.72 | 2.73 | 2.71 | 2.72 |
| After | 2.88 | 2.9 | 2.93 | 2.91 |
| Delta K | 0.16 | 0.17 | 0.22 | 0.19 |

Example 95O, shown in FIG. 1, can be also applied to Aluminum Back End of the Line (Al BEOL) clean. FIG. 1 demonstrates that the residue on an Al pattern wafer can be effectively removed at 25° C. for 1 min.

Examples of replenishment formulations include the following compositions 43A and 93B

| 43A | wt % |
|---|---|
| DIW | 55.45 |
| Propylene glycol (PG) | 29.83 |
| N,N-diethylhydroxylamine (DEHA) | 12.27 |
| ethanolamine (MEA) | 2.45 |

| 93B | wt % |
|---|---|
| DIW | 33.15 |
| ethanolamine (MEA) | 4.5 |
| N,N-diethylhydroxylamine (DEHA) | 35 |
| Propylene glycol (PG) | 27.35 |

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

What is claimed is:

1. A composition useful for removing residue from a semiconductor substrate, the composition consisting of:
    a) from about 15% to about 50% by weight of water;
    b) from about 10% to about 65% by weight of a water-miscible organic solvent;
    c) from about 1% to about 50% by weight of an amine compound selected from the group consisting of a at least one alkanolamine and aminopropylmorpholine;
    d) from about 1% to about 25% by weight of an organic acid;
    e) from about 0.01% to about 8% by weight of a fluoride ion source, wherein the water-miscible organic solvent is not an ether; and
    f) optionally, from about 0.1% to about 15% b weight of a corrosion inhibitor selected from the group consisting of benzotriazole, amino-benzotriazole, L-ascorbic acid, gallic acid, vanillin, diethylhydroxylamine, and mixtures thereof.

2. The composition of claim 1 wherein the water-miscible organic solvent is selected from the group consisting of propylene glycol, glycerol, dimethylacetamide, tetrahydrofuryl alcohol, ethylene glycol, hexylene glycol, and mixtures thereof.

3. The composition of claim 2 wherein the water-miscible organic solvent is dimethylacetamide.

4. The composition of claim 2 wherein the water-miscible organic solvent is propylene glycol.

5. The composition of claim 2 wherein the water-miscible organic solvent is glycerol.

6. The composition of claim 1 wherein the fluoride ion source is selected from the group consisting of ammonium fluoride and a quaternary ammonium compound.

7. The composition of claim 6 wherein the fluoride ion source is ammonium fluoride.

8. The composition of claim 6 wherein the fluoride ion source is a quaternary ammonium compound selected from the group consisting of tetramethylammonium fluoride and tetrabutylammonium fluoride.

9. The composition of claim 1 wherein the amine compound is an alkanolamine selected from the group consisting of N-methylethanolamine (NMEA), monoethanolamine (MEA), diethanolamine, mono-, di- and triisopropanolamine, 2-(2-aminoethylamino)ethanol, 2-(2-aminoethoxy)ethanol, triethanolamine, N-ethyl ethanolamine, N,N-dimethylethanolamine, N,N-diethyl ethanolamine, N-methyl diethanolamine, N-ethyl diethanolamine, cyclohexylaminediethanol, and mixtures thereof.

10. The composition of claim 9 wherein the alkanolamine is monoethanolamine.

11. The composition of claim 9 wherein the amine compound is aminopropylmorpholine.

12. The composition of claim 9 wherein the amine compound is triethanolamine.

13. The composition of claim 9 wherein the amine compound is a mixture of triethanolamine and 2-(2-aminoethoxy)ethanol.

14. The composition of claim 1 wherein the composition consists of:
    a) from about 35% to about 50% by weight of water;
    b) from about 10% to about 30% by weight of the water-miscible organic solvent;
    c) from about 8% to about 50% by weight of the amine compound selected from the group consisting of a at least one alkanolamine and aminopropylmorpholine;
    d) from about 6% to about 10% by weight of the organic acid;
    e) from about 1% to about 8% by weight of the fluoride ion source; and
    f) optionally, from about 0.1% to about 15% by weight of a corrosion inhibitor selected from the group consisting of benzotriazole, amino-benzotriazole, L-ascorbic acid, gallic acid, vanillin, diethylhydroxylamine, and mixtures thereof.

15. A method for removing residue from a semiconductor substrate, the method comprising the steps of:
    contacting the semiconductor substrate with a cleaning composition of claim 1, wherein the semiconductor substrate comprises a porous dielectric material having a dielectric constant;
    rinsing the cleaning composition from the semiconductor substrate; and
    drying the semiconductor substrate, wherein the dielectric constant of the porous dielectric material does not increase more than 0.50.

16. The method of claim 15 wherein the dielectric constant of the porous dielectric material does not increase more than 0.25.

17. The method claim 15 wherein the cleaning composition provides a copper etch rate of 4 Å/min or less.

18. A replenishment composition to be added to a cleaning composition, said replenishment composition consisting of: a) from about 20% to about 84% by weight of water; b) from about 15% to about 40% by weight of a water-miscible organic solvent, wherein the water-miscible solvent is not an ether; c) from about 1% to about 5% by weight of an amine compound selected from the group consisting of at least one alkanolamine; at least one aminopropylmorpholine; and optionally, from about 4% to about 35% by weight of diethyl hydroxylamine, and said water is from about 20 to about 80% of the replenishment composition.

19. A method for removing unwanted residues from a semiconductor substrate comprising the steps of: contacting the semiconductor substrate with a cleaning composition consisting of: a) from about 15% to about 50% by weight of water; b) from about 10% to about 65% by weight of a water-miscible organic solvent, wherein the water-miscible solvent is not an ether; c) from about 1% to about 20% by weight of an amine compound selected from the group consisting of at least one alkanolamine and at least one aminopropylmorpholine; d) from about 1% to about 25% by weight of at least one organic acid; e) from about 0.01% to about 8% by weight of a fluoride ion source; and f) from about 1 to about 15% by weight of diethyl hydroxylamine, wherein said contacting step results in a loss of a portion of said cleaning composition; and adding a replenishment composition to said cleaning composition; said replenishment composition consisting of a composition of claim 18.

20. The method of claim 19 further comprising the steps of rinsing the cleaning composition from the semiconductor substrate; and drying the semiconductor substrate, wherein the semiconductor substrate comprises a porous dielectric material having a dielectric constant; and wherein after said contacting, rinsing and drying steps the dielectric constant of the porous dielectric material does not increase more than 0.50.

21. The method of claim 20 wherein the dielectric constant of porous dielectric material does not increase more than 0.25.

* * * * *